US012614673B2

(12) United States Patent
Nishisaka

(10) Patent No.: US 12,614,673 B2
(45) Date of Patent: Apr. 28, 2026

(54) ELECTRONIC COMPONENT INCLUDING OUTERMOST LAYER OF OUTER ELECTRODE NOT ELECTRICALLY CONNECTED TO INNER ELECTRODE AND METHOD FOR PRODUCING MOUNT STRUCTURE

(71) Applicant: Murata Manufacturing Co., Ltd., Nagaokakyo (JP)

(72) Inventor: Yasuhiro Nishisaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 850 days.

(21) Appl. No.: 17/143,253

(22) Filed: Jan. 7, 2021

(65) Prior Publication Data

US 2021/0249190 A1      Aug. 12, 2021

(30) Foreign Application Priority Data

Feb. 12, 2020    (JP) .................................. 2020-021662

(51) Int. Cl.
| | |
|---|---|
| *H01G 4/232* | (2006.01) |
| *H01G 4/12* | (2006.01) |
| *H01G 4/30* | (2006.01) |
| *H05K 3/32* | (2006.01) |
| *H05K 3/328* | (2026.01) |

(52) U.S. Cl.
CPC ............. *H01G 4/2325* (2013.01); *H01G 4/30* (2013.01); *H05K 3/328* (2013.01); *H01G 4/1227* (2013.01)

(58) Field of Classification Search
CPC ...... H01G 4/1227; H01G 4/2325; H01G 4/30; H05K 1/181; H05K 2201/10015; H05K 2201/10636; H05K 2203/1131; H05K 3/32; H05K 3/328
See application file for complete search history.

(56) References Cited

U.S. PATENT DOCUMENTS

| | | | | | |
|---|---|---|---|---|---|
| 5,495,386 | A | * | 2/1996 | Kulkarni ................ | H01C 7/112 |
| | | | | | 361/321.1 |
| 6,344,963 | B1 | * | 2/2002 | Mori ...................... | H01G 4/232 |
| | | | | | 361/306.3 |
| 2008/0223606 | A1 | | 9/2008 | Tsukizawa et al. | |
| 2011/0157767 | A1 | * | 6/2011 | Hur .......................... | H01G 4/01 |
| | | | | | 361/303 |
| 2013/0050896 | A1 | * | 2/2013 | Park ....................... | H01G 4/228 |
| | | | | | 361/321.1 |
| 2013/0063862 | A1 | * | 3/2013 | Kim .......................... | H01G 4/30 |
| | | | | | 156/182 |

(Continued)

FOREIGN PATENT DOCUMENTS

| | | | |
|---|---|---|---|
| JP | S62168628 | U | 10/1987 |
| JP | H097878 | A | 1/1997 |

(Continued)

OTHER PUBLICATIONS

Office Action in JP2020-021662, mailed Sep. 6, 2022, 5 pages.

*Primary Examiner* — Minh N Trinh

(74) *Attorney, Agent, or Firm* — Keating & Bennett, LLP

(57) ABSTRACT

An electronic component includes a body, an inner electrode within the body, and an outer electrode outside of the body, wherein the outer electrode includes an outermost layer that includes metal particles but is not electrically connected to the inner electrode.

11 Claims, 4 Drawing Sheets

(56) References Cited

U.S. PATENT DOCUMENTS

| | | | | |
|---|---|---|---|---|
| 2014/0192453 A1* | 7/2014 | Hong | ....................... | H01G 4/12 |
| | | | | 156/89.18 |
| 2014/0293503 A1* | 10/2014 | Sasabayashi | ......... | H01G 4/232 |
| | | | | 361/301.4 |
| 2015/0380164 A1* | 12/2015 | Kodama | ............. | H01G 4/0085 |
| | | | | 361/301.4 |
| 2016/0276104 A1* | 9/2016 | Nishisaka | ............ | H01G 4/2325 |
| 2017/0358384 A1* | 12/2017 | Kageyama | ............... | H01B 1/22 |
| 2018/0233286 A1* | 8/2018 | Yu | ............................ | H01G 4/33 |
| 2019/0304683 A1* | 10/2019 | Terashita | ............... | H01G 4/228 |
| 2021/0057155 A1* | 2/2021 | Zenzai | ................... | H01G 4/008 |
| 2021/0249190 A1* | 8/2021 | Nishisaka | ............... | H05K 3/32 |

FOREIGN PATENT DOCUMENTS

| | | | |
|---|---|---|---|
| JP | 2000277371 A | 10/2000 |
| JP | 2000-357627 A | 12/2000 |
| JP | 2006278162 A | 10/2006 |
| JP | 2011238834 A | 11/2011 |
| WO | 2006027876 A1 | 3/2006 |

* cited by examiner

ELECTRONIC COMPONENT INCLUDING OUTERMOST LAYER OF OUTER ELECTRODE NOT ELECTRICALLY CONNECTED TO INNER ELECTRODE AND METHOD FOR PRODUCING MOUNT STRUCTURE

CROSS REFERENCE TO RELATED APPLICATIONS

This application claims the benefit of priority to Japanese Patent Application No. 2020-021662 filed on Feb. 12, 2020. The entire contents of this application are hereby incorporated herein by reference.

BACKGROUND OF THE INVENTION

1. Field of the Invention

The present invention relates to an electronic component, a method for producing an electronic component, and a method for producing a mount structure.

2. Description of the Related Art

Electronic components, such as multilayer ceramic capacitors, include a body, an inner electrode disposed within the body, and an outer electrode disposed outside of the body. As the method of mounting such an electronic component on a circuit board, the dominant method is to use solder to achieve bonding between a land of the circuit board and the outer electrode of the electronic component.

In this way, existing electronic components are to be soldered and, thus, are often provided with outer electrodes that have a trilayer structure. Japanese Unexamined Patent Application Publication No. 2000-357627 describes a trilayer outer electrode having the following structure: the first layer in contact with the body is formed by sintering metal; the second layer is a plated coating of Ni, Cu, or an alloy of the foregoing formed so as to cover the first layer; and the third layer is a plated coating of Sn or solder formed so as to cover the second layer.

The first layer of such an outer electrode is an underlying layer formed for establishing electrical connection to the inner electrode. However, when the first layer is brought into direct contact with solder for bonding to a land of the circuit board, the metal component of the first layer is absorbed by the solder, which is a phenomenon called "dissolution of metallization". Thus, in order to prevent the dissolution of metallization phenomenon, the second layer defined by a plated coating of, for example, Ni is formed on the surface of the first layer. However, oxidation of the plated coating of the second layer results in a decrease in the adhesion to solder. Thus, in order to prevent oxidation of the plated coating of the second layer, the third layer defined by a plated coating of, for example, Sn is formed. As the third layer, use of the plated coating of, for example, Sn provides solder wettability.

As described above, the presence of an oxide film in the surface of the outer electrode causes a decrease in the adhesion to solder. Thus, solder ordinarily contains flux for removing oxide films.

However, the method of mounting an electronic component using soldering and plating may cause a reduction in the quality as described in (1) below. In particular, the method of mounting a ceramic electronic component including a body of ceramic may cause a reduction in the quality as described in, in addition to (1), (2) and (3) below.

(1) Solder used in soldering has insufficient heat resistance. For example, in the case of automotive applications, when electronic components are used in a high-temperature environment, the difference in thermal shrinkage between such an electronic component and the circuit board causes cracking in the fillet of solder, which results in degradation of connection reliability.

(2) Flux included in the solder corrodes the ceramic body, resulting in a decrease in the insulation resistance (IR).

(3) Acid or alkali included in the plating solution used in plating also corrodes the ceramic body, resulting in a decrease in the insulation resistance.

SUMMARY OF THE INVENTION

Preferred embodiments of the present invention provide electronic components that are each mountable on a circuit board without soldering or plating, methods for producing such electronic components, and methods for producing mount structures using such electronic components.

An electronic component according to a preferred embodiment of the present invention includes a body, an inner electrode disposed within the body, and an outer electrode disposed outside of the body, wherein the outer electrode includes an outermost layer that includes metal particles but is not electrically connected to the inner electrode.

A method for producing an electronic component according to a preferred embodiment of the present invention includes a step of preparing a body within which an inner electrode is disposed, and a step of forming an outer electrode outside of the body, wherein, in the step of forming the outer electrode, an outermost-layer-forming conductive paste including metal particles and a solvent is applied to a surface, and subsequently, the outermost-layer-forming conductive paste is dried at a temperature at which the solvent evaporates but sintering of the metal particles does not begin, to form a dry film as an outermost layer of the outer electrode.

A method for producing a mount structure according to a preferred embodiment of the present invention includes a step of mounting an electronic component according to a preferred embodiment of the present invention or an electronic component produced by a production method according to a preferred embodiment of the present invention, on a land of a circuit board, and a step of firing the electronic component on the land, wherein the step of firing the electronic component is performed to sinter the metal particles included in the outermost layer of the outer electrode.

Preferred embodiments of the present invention provide electronic components that are each mountable on a circuit board without soldering or plating.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, electronic components, methods for producing electronic components, and methods for producing mount structures according to preferred embodiments of the present invention will be described with reference to the drawings.

However, the present invention is not limited to the following features, and changes may be appropriately made without departing from the spirit and scope of the present invention. Preferred embodiments in which two or more preferable features among the following features are combined also fall within the scope of the present invention.
Electronic Component Electronic components according to preferred embodiments of the present invention are various chip electronic components. The electronic components are, for example, ceramic electronic components including a ceramic body. Examples of the ceramic electronic components include multilayer ceramic electronic components, such as multilayer ceramic capacitors, multilayer inductors, and multilayer LC components. Electronic components according to preferred embodiments of the present invention are not necessarily ceramic electronic components.

Figure 1:
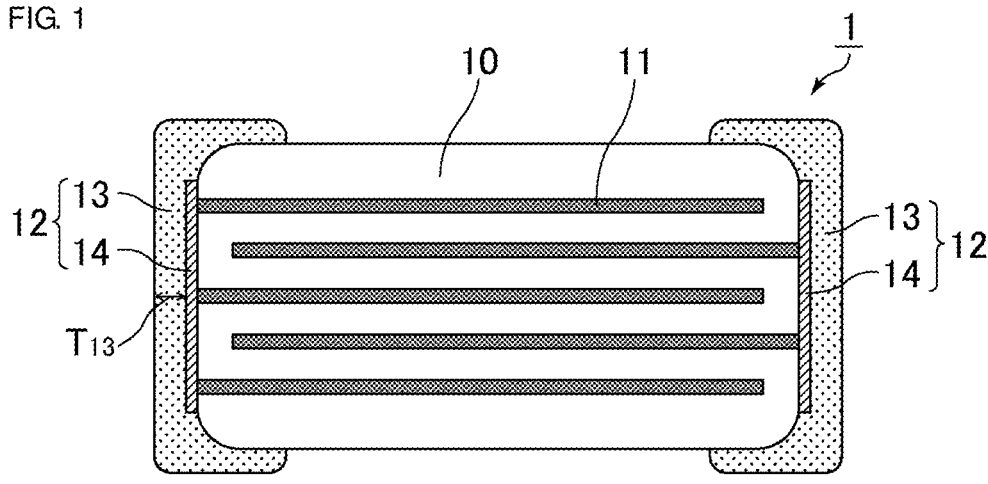
FIG. 1 is a schematic sectional view illustrating an example of an electronic component according to a preferred embodiment of the present invention.

FIG. 1 is a schematic sectional view illustrating an example of an electronic component according to a preferred embodiment of the present invention.

Referring to FIG. 1, an electronic component 1 includes a body 10, an inner electrode 11 disposed within the body 10, and an outer electrode 12 disposed outside of the body

10. In the electronic component 1, the outer electrode 12 includes, sequentially from outside to inside, an outermost layer 13 and an underlying layer 14. The underlying layer 14 is disposed on the surface of the body 10. The outermost layer 13 is disposed on the surface of the underlying layer 14.

Figure 2:
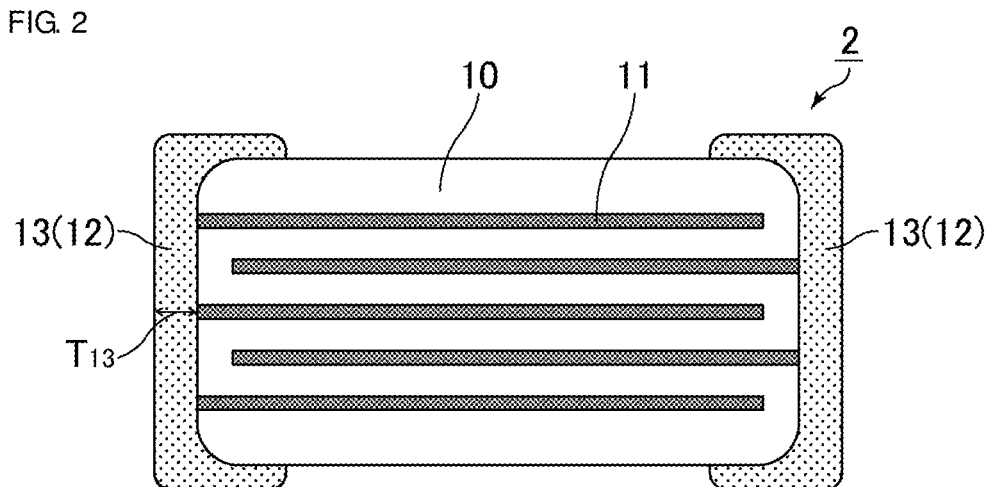
FIG. 2 is a schematic sectional view illustrating another example of an electronic component according to a preferred embodiment of the present invention.

FIG. 2 is a schematic sectional view illustrating another example of an electronic component according to a preferred embodiment of the present invention.

Referring to FIG. 2, an electronic component 2 has the same or substantially the same configuration as in the electronic component 1 in FIG. 1, except that the outer electrode 12 does not include the underlying layer 14, and the outermost layer 13 is disposed on the surface of the body 10.

Such an electronic component according to a preferred embodiment of the present invention includes the following feature: an outer electrode includes an outermost layer that includes metal particles but is not electrically connected to an inner electrode.

As described below, an electronic component according to a preferred embodiment of the present invention is mountable on a circuit board without soldering or plating. Thus, a reduction in the quality described in (1) above is prevented. In particular, when the body is a ceramic body, a reduction in the quality of, in addition to (1) above, (2) and (3) is prevented.

Figure 3:
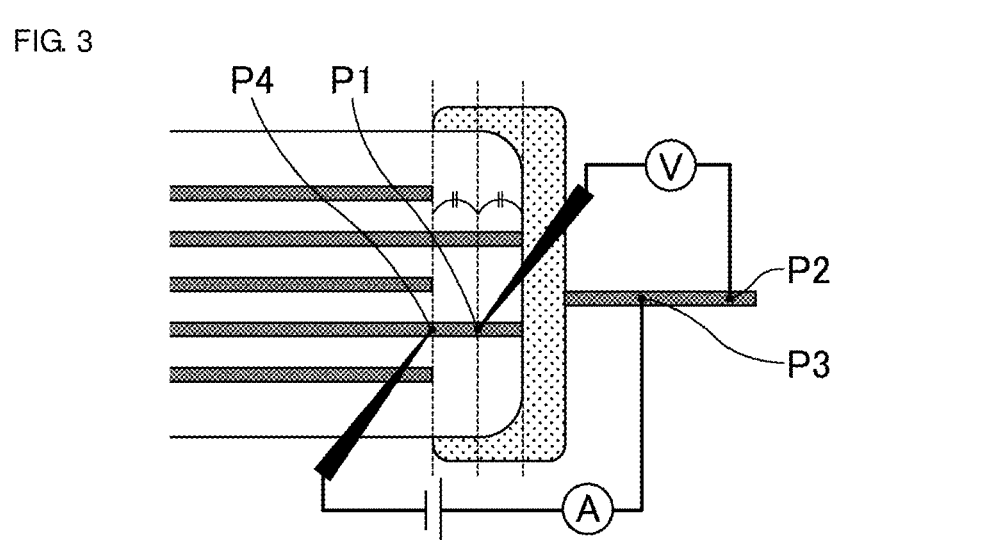
FIG. 3 is a schematic explanatory view of a method of checking electrical connection between an inner electrode and an outer electrode.

FIG. 3 is a schematic explanatory view of a method of checking electrical connection between an inner electrode and an outer electrode.

An electronic component is polished to expose a section. Referring to FIG. 3, an instrument is then attached to positions P1, P2, P3, and P4, and the four-point probe method is performed to measure the resistance between P1 and P3 (about 2 cm to about 3 cm, for example). The voltage between P1 and P2 and the current between P3 and P4 are measured using, for example, a digital multimeter (PC7000, manufactured by SANWA ELECTRIC INSTRUMENT CO., LTD.).

When the measurement voltage is set to about 100 mV and electrical connection between the inner electrode and the outer electrode is not established, the current is less than about 1 mA or is unmeasurable. On the other hand, when electrical connection between the inner electrode and the outer electrode is established, a current of, for example, several tens of to several hundreds of milliamperes according to Ohm's law can be measured.

In an electronic component according to a preferred embodiment of the present invention, the metal particles included in the outermost layer of the outer electrode are not sintered. Stated another way, in the outermost layer of the outer electrode, necking between the metal particles does not occur. In the outermost layer of the outer electrode, the metal particles are dispersed within a resin described below. Thus, the outermost layer of the outer electrode is not electrically connected to the inner electrode.

The metal of the metal particles included in the outermost layer of the outer electrode is preferably, for example, Cu, Ni, Ag, or an alloy including at least one of these metals.

The metal particles included in the outermost layer of the outer electrode preferably have an average particle size of about 10 nm or more and about 1000 nm or less, for example. When the metal particles have an average particle size in this range, the metal particles can be sintered at a temperature lower than the melting point of the metal of the metal particles.

The average particle size of the metal particles included in the outermost layer of the outer electrode can be measured in the following manner. A scanning electron microscope (SEM) is used to observe, within a field of view of, for example, about 30 μm×about 30 μm, a section of the outermost layer of the outer electrode. The particle sizes of metal particles at 10 or more points are individually measured by the line method. The average particle size of the equivalent circular diameters of the metal particles within the field of view is defined as the average particle size of the metal particles.

The outermost layer of the outer electrode preferably has a thickness (in FIG. 1 and FIG. 2, length denoted by arrow $T_{13}$) of about 1 μm or more, for example. In addition, the outermost layer of the outer electrode preferably has a thickness of, for example, about 100 μm or less.

The thickness of the outermost layer of the outer electrode can be measured in the following manner. A SEM is used to observe three random points in a section of the outermost layer of the outer electrode, such that the entire outermost layer (in the direction denoted by arrow $T_{13}$) of the outer electrode is within each field of view. In each field of view, the thickness of the outermost layer of the outer electrode is measured at three points. In all of the fields of view, this measurement is performed and the average value of the measured values at all of the measurement points is defined as the thickness of the outermost layer of the outer electrode.

The outermost layer of the outer electrode preferably further includes a thermally decomposable resin. The thermally decomposable resin may be of a single species or two or more species.

The thermally decomposable resin preferably has a thermal decomposition temperature of about 100° C. or more and about 350° C. or less, for example. The thermal decomposition temperature means, in measurement using a thermobalance at a heating rate of about 10° C./min, a temperature at which the weight of the resin decreases by about 5 wt %.

The thermally decomposable resin is preferably, for example, an acrylic resin, a butyral resin, or a cellulosic resin.

The acrylic resin is, for example, a homopolymer of an alkyl (meth)acrylate, or a copolymer including an alkyl (meth)acrylate as a main monomer (component accounting for about 50 mass % or more of the total monomer amount; hereafter, the same definition) and an auxiliary monomer that is copolymerizable with the main monomer. Specific examples of the homopolymer include polymethyl (meth) acrylate, polyethyl (meth)acrylate, and polybutyl (meth) acrylate. Specific examples of the copolymer include a block copolymer including, as constitutional units, a methacrylate polymer block and an acrylate polymer block. Incidentally, (meth)acrylate means acrylate and/or methacrylate.

The butyral resin is, for example, a homopolymer of vinyl acetate or a copolymer including vinyl acetate as a main monomer and an auxiliary monomer that is copolymerizable with the main monomer. Specific examples of the homopolymer include polyvinyl butyral. Specific examples of the copolymer include polyvinyl butyral (PVB) in which the main chain skeleton includes, as constitutional repeating units, vinyl butyral (butyral group), vinyl acetate (acetyl group), and vinyl alcohol (hydroxy group).

The cellulosic resin is, for example, a cellulose organic acid ester (cellulose derivative) in which the hydrogen atoms of the hydroxy groups of cellulose defining and functioning as a constitutional repeating unit are partially or entirely substituted with an alkyl group such as a methyl group, an ethyl group, a propyl group, an isopropyl group, or a butyl group, an acyl group such as an acetyl group, a propionyl group, or a butyryl group, a methylol group, an ethylol group, a carboxymethyl group, or a carboxyethyl group. Specific examples include methylcellulose, ethylcellulose, hydroxymethylcellulose, hydroxyethylcellulose, hydroxypropylcellulose, hydroxypropylmethylcellulose, carboxymethylcellulose, carboxyethylcellulose, carboxyethylmethylcellulose, cellulose acetate phthalate, and nitrocellulose.

The outermost layer of the outer electrode may further include a fixing auxiliary material, such as glass or a thermosetting resin, for example. This provides an increase in the fixing strength during mounting.

Examples of the glass included in the outermost layer of the outer electrode include glass including at least one selected from B, Si, Ba, Mg, Al, Li, P, Te, V, Bi, Sn, In, and Na. Examples of the thermosetting resin included in the outermost layer of the outer electrode include epoxy resins.

Referring to FIG. 1, when the outer electrode includes the underlying layer, the underlying layer is preferably a metallized layer, for example. The metallized layer includes glass and metal. Examples of the metal of the metallized layer include Cu, Ni, and Ag. The metallized layer is formed by applying an underlying-layer-forming conductive paste including glass and metal particles to the surface of the body and firing the conductive paste to achieve metallization. When the body is a ceramic body, the metallized layer may be formed by co-firing together with the ceramic body and the inner electrode, or may be formed by firing performed after firing of the ceramic body and the inner electrode.

The underlying layer preferably has a thickness of about 10 nm or more and about 100 μm or less, for example. The thickness of the underlying layer can be measured by the same method as in the thickness of the outermost layer. The underlying layer may include multiple layers.

In an electronic component according to a preferred embodiment of the present invention, the body, such as a ceramic body, is made of a material appropriately selected in accordance with the function of the electronic component. For example, when the electronic component is a ceramic capacitor, the body is made of a dielectric ceramic. Examples of the dielectric ceramic include perovskite compounds including Ba and Ti.

When the electronic component is a ceramic capacitor, the inner electrode is preferably made of, for example, a metal such as Ni, Cu, Ag, Pd, Au, or Ag—Pd alloy.

Method for Producing Electronic Component

Hereinafter, an example of a method for producing an electronic component according to a preferred embodiment of the present invention will be described.

Figures 4, 5, 6:
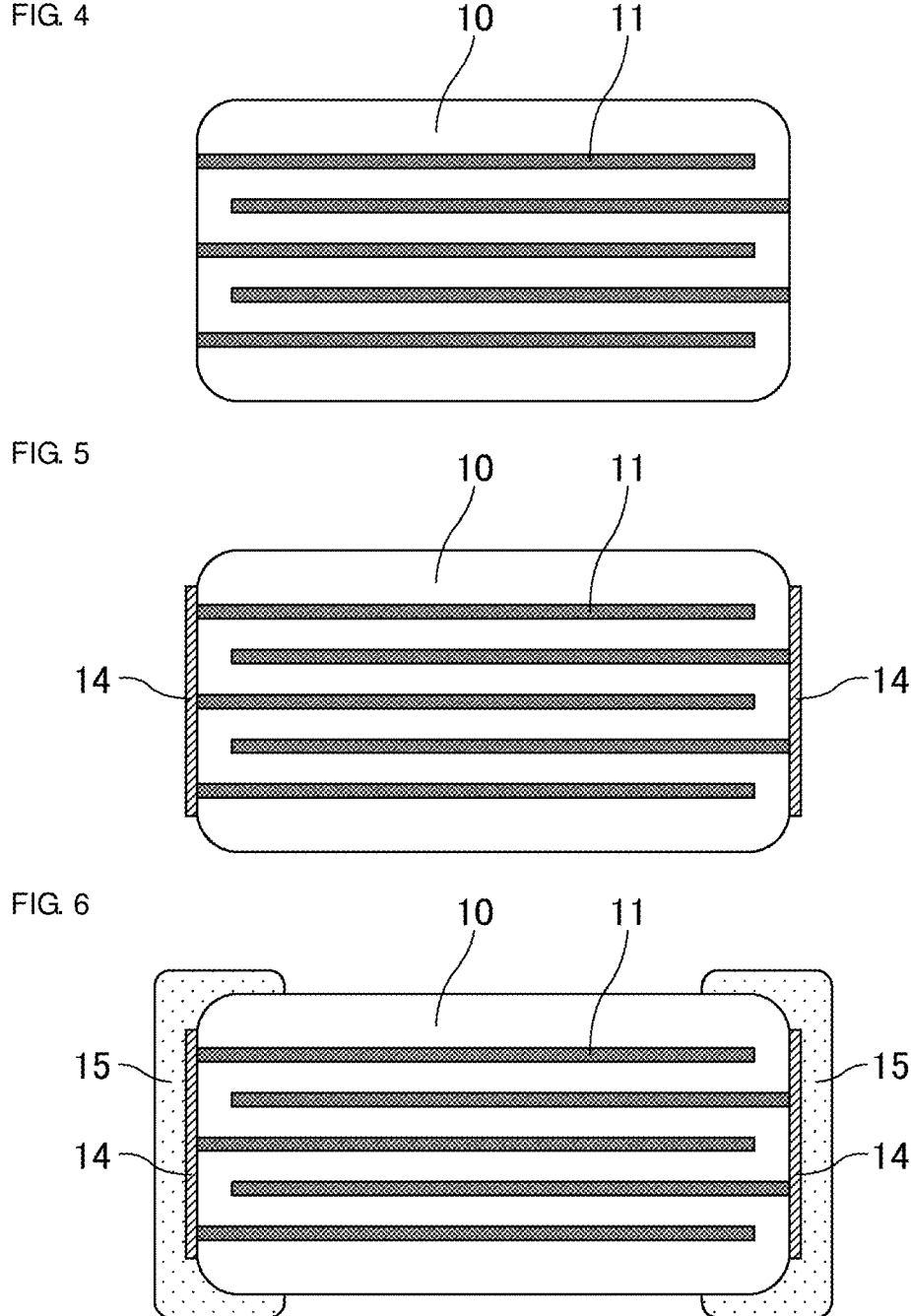
FIG. 4 is a schematic sectional view illustrating an example of a step of preparing a body within which an inner electrode is disposed according to a preferred embodiment of the present invention.
FIG. 5 is a schematic sectional view illustrating an example of a step of forming an underlying layer of an outer electrode according to a preferred embodiment of the present invention.
FIG. 6 is a schematic sectional view illustrating an example of a step of applying an outermost-layer-forming conductive paste containing metal particles and a solvent according to a preferred embodiment of the present invention.

FIG. 4 is a schematic sectional view illustrating an example of a step of preparing a body within which an inner electrode is disposed.

A body 10 within which an inner electrode 11 is disposed is prepared. In a case of forming an underlying layer 14 of the outer electrode as described later, the body 10 may be a green body or a fired body.

FIG. 5 is a schematic sectional view illustrating an example of a step of forming the underlying layer of the outer electrode.

On the surface of the body 10, the underlying layer 14 of the outer electrode is formed. For example, an underlying-layer-forming conductive paste including glass and metal particles is applied to the surface of the body 10 and fired, to thus form a metallized layer as the underlying layer 14 of the outer electrode. As long as the underlying layer 14 is electrically connected to the inner electrode 11, the material and formation process of the underlying layer 14 are not particularly limited. For example, plating, sputtering, or vapor deposition may be performed to form the underlying layer 14.

FIG. 6 is a schematic sectional view illustrating an example of a step of applying an outermost-layer-forming conductive paste including metal particles and a solvent.

An outermost-layer-forming conductive paste 15 including metal particles and a solvent is applied to the surface of the underlying layer 14. Referring to FIG. 6, the outermost-layer-forming conductive paste 15 is preferably applied to the surface of the body 10.

Examples of the process of applying the outermost-layer-forming conductive paste include dipping, spraying, and screen printing.

Examples of the metal of the metal particles included in the outermost-layer-forming conductive paste include Cu, Ni, Ag, or an alloy including at least one of these metals.

The metal particles included in the outermost-layer-forming conductive paste preferably have an average particle size of about 10 nm or more and about 1000 nm or less, for example. When the metal particles have an average particle size in the range, the metal particles can be sintered at a temperature lower than the melting point of the metal of the metal particles.

The average particle size of the metal particles included in the outermost-layer-forming conductive paste can be measured by the laser diffraction-scattering method, and determined as a median diameter (D50). The average particle size of the metal particles included in the outermost-layer-forming conductive paste is regarded as being the same as the average particle size of the metal particles included in the outermost layer of the outer electrode of the electronic component as a finished product.

The metal particle content of the outermost-layer-forming conductive paste can be appropriately adjusted in accordance with a desired thickness, and is preferably about 3 vol % or more and about 30 vol % or less, for example.

The outermost-layer-forming conductive paste preferably further includes the thermally decomposable resin described above.

The outermost-layer-forming conductive paste may further include the fixing auxiliary material, such as glass or a thermosetting resin, for example, described above.

Figure 7:
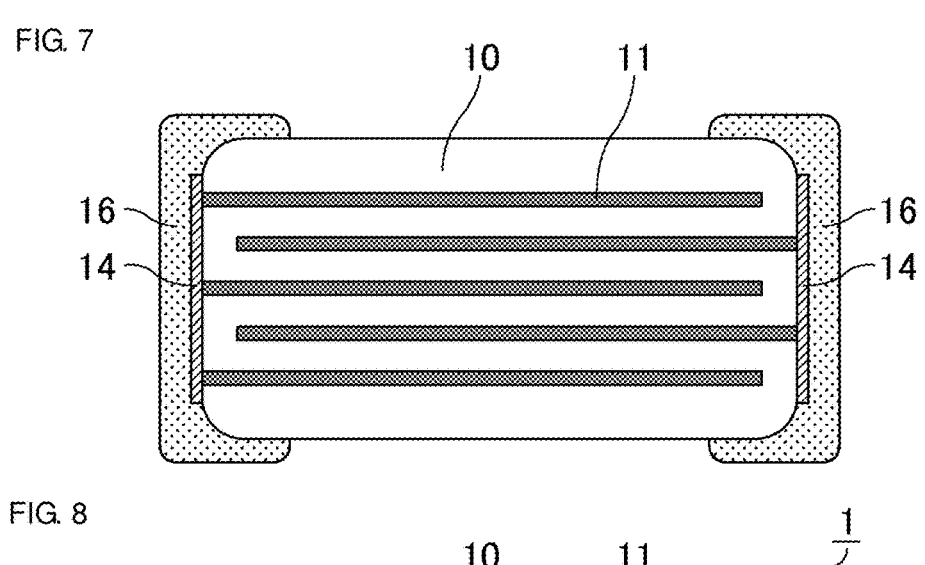
FIG. 7 is a schematic sectional view illustrating an example of a step of drying an outermost-layer-forming conductive paste according to a preferred embodiment of the present invention.

FIG. 7 is a schematic sectional view illustrating an example of a step of drying the outermost-layer-forming conductive paste.

The outermost-layer-forming conductive paste 15 is dried at a temperature at which the solvent evaporates but sintering of the metal particles does not begin. As a result, the outermost-layer-forming conductive paste 15 is turned into a dry film 16 including the metal particles, and this dry film 16 defines and functions as the outermost layer of the outer electrode. The dry film 16 is preferably not electrically connected to the inner electrode 11. However, the dry film 16 may be electrically connected to the inner electrode 11.

In a case where the outermost-layer-forming conductive paste 15 includes the thermally decomposable resin, the dry film 16 includes the thermally decomposable resin. Similarly, in a case where the outermost-layer-forming conductive paste 15 includes the fixing auxiliary material, the dry film 16 includes the fixing auxiliary material.

The drying temperature for the outermost-layer-forming conductive paste is preferably, for example, about 25° C. or more and about 120° C. or less, for example.

A method for producing an electronic component according to a preferred embodiment of the present invention has the following feature: in order to form the dry film, the outermost-layer-forming conductive paste is only dried. Specifically, this feature of the method for producing an electronic component according to a preferred embodiment of the present invention means that a firing treatment for sintering the metal particles is not performed.

The underlying layer 14 on the surface of the body 10 may not be formed, and the outermost-layer-forming conductive paste 15 including metal particles and a solvent may be applied to the surface of the body 10. Subsequently, the dry film 16 may be formed as the outermost layer 13 of the outer electrode 12. In such a case of not forming the underlying layer 14, the body 10 can be provided as a fired body.

Method for Producing Mount Structure

Hereinafter, an example of a method for producing a mount structure according to a preferred embodiment of the present invention will be described.

Figure 8:
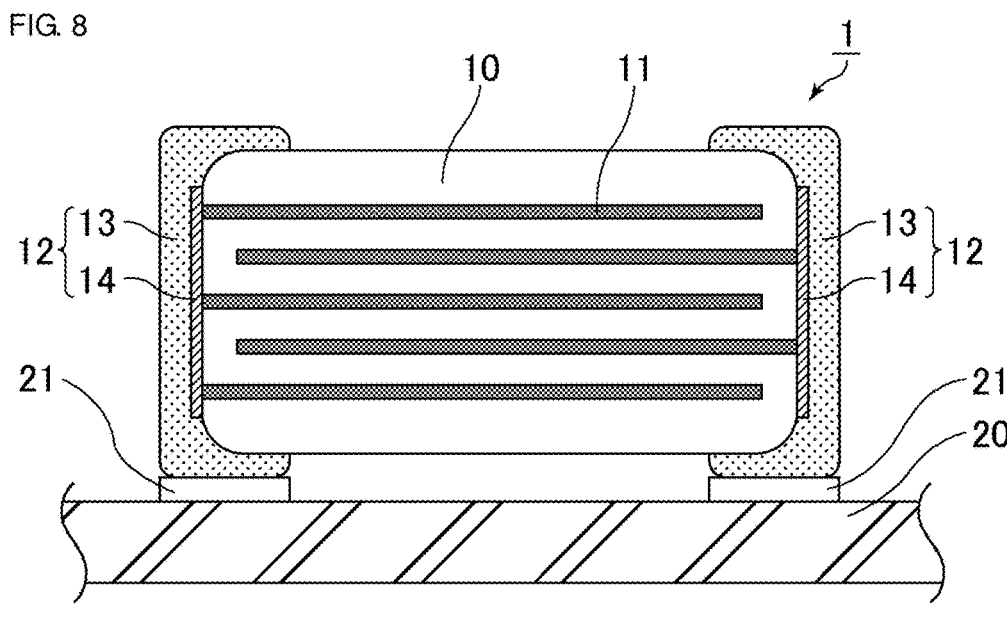
FIG. 8 is a schematic sectional view illustrating an example of a step of mounting an electronic component according to a preferred embodiment of the present invention.

FIG. 8 is a schematic sectional view illustrating an example of a step of mounting an electronic component.

Referring to FIG. 8, the electronic component 1 in FIG. 1 is mounted on a land 21 of a circuit board 20. Specifically, the bottom surface of the outer electrode 12 of the electronic component 1 faces the land 21 of the circuit board.

Figure 9:
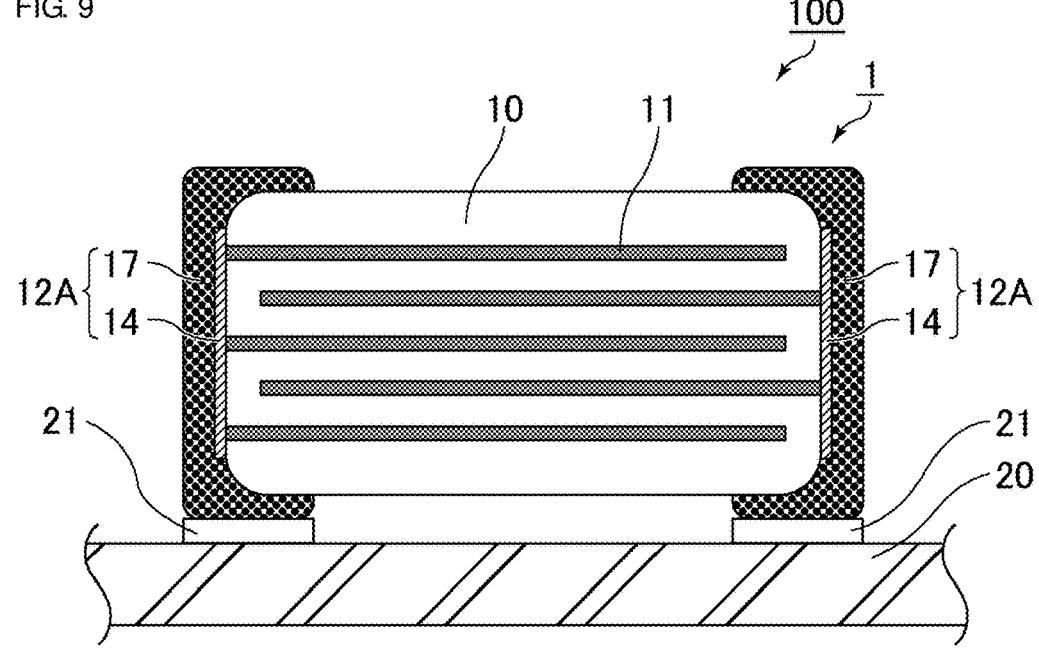
FIG. 9 is a schematic sectional view illustrating an example of a step of firing an electronic component according to a preferred embodiment of the present invention.

FIG. 9 is a schematic sectional view illustrating an example of a step of firing the electronic component.

The electronic component 1 on the land 21 is fired, to sinter the metal particles included in the outermost layer 13 of the outer electrode 12 in FIG. 8. As a result, referring to FIG. 9, a sinter layer 17 is formed as the outermost layer of an outer electrode 12A, and the outer electrode 12A is electrically connected to the inner electrode 11. As a result, a mount structure 100 is provided. In a case where the outermost layer 13 of the outer electrode 12 in FIG. 8 includes the thermally decomposable resin, the firing causes decomposition of the thermally decomposable resin.

Figure 10:
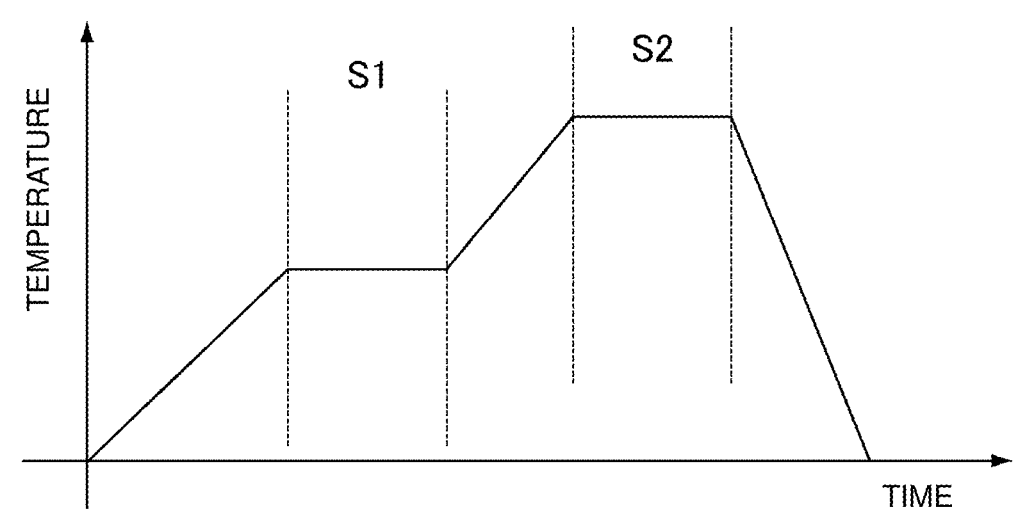
FIG. 10 is an example of a firing profile according to a preferred embodiment of the present invention.

FIG. 10 is an example of the firing profile.

Referring to FIG. 10, the firing temperature preferably includes two stages. In the temperature region of the former stage denoted by S1, organic materials, such as the thermally decomposable resin, are thermally decomposed. In the temperature range of the latter stage denoted by S2, the metal particles are sintered. However, in a case where the organic materials are easily decomposed, the two-stage profile may or may not be used.

Figure 11:
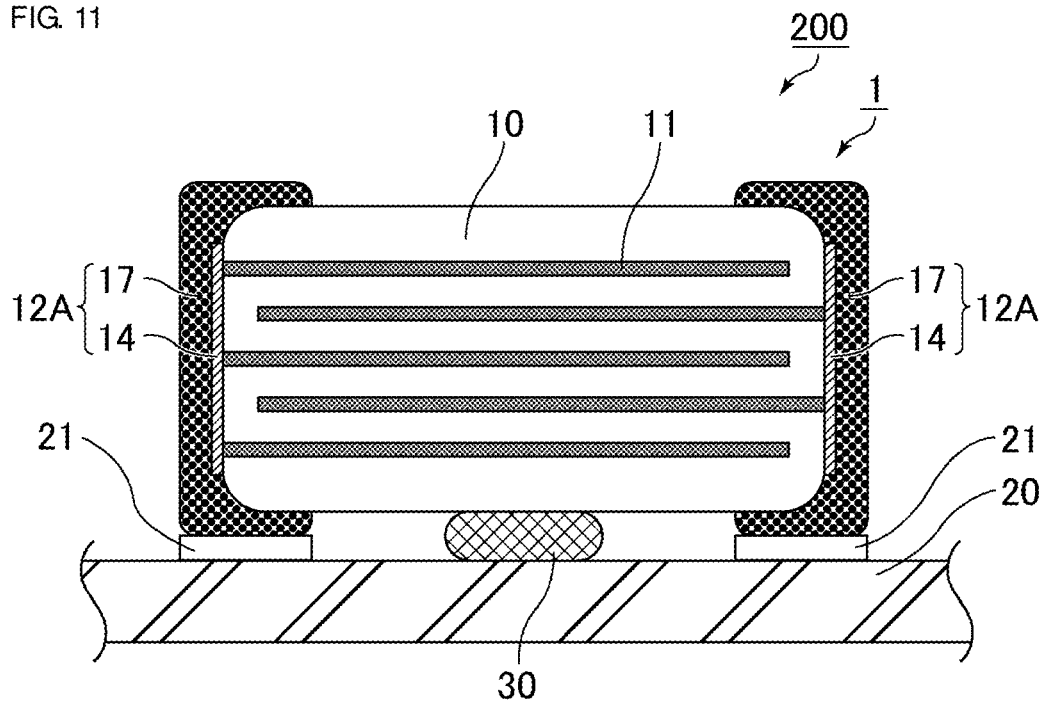
FIG. 11 is a schematic sectional view illustrating an example of a mount structure according to a preferred embodiment of the present invention.

FIG. 11 is a schematic sectional view illustrating another example of the mount structure.

Referring to FIG. 11, in a mount structure 200, a fixing material 30 made of a curable resin, such as an epoxy resin, for example, is disposed between the body 10 and the circuit board 20, to thus achieve fixing together of the body 10 and the circuit board 20.

As described above, preferred embodiments of the present invention enable mounting on a circuit board without soldering or plating. Thus, a reduction in the quality as described in (1) above is prevented. In particular, in a case where the body is a ceramic body, a reduction in the quality as described in, in addition to (1), (2) and (3) is prevented.

For chip electronic components, a reduction in the formation costs of outer electrodes is achieved. In addition, elimination of the use of solder enables fine pitch mounting and high-density mounting.

In the related art, outer electrodes have, in addition to the function of providing electrical connection between the inner electrode and the circuit board, a function of fixing the body to the circuit board. However, referring to FIG. 11, the fixing material 30 may be provided, so that the outer electrode can have only the function of providing electrical connection.

Electronic components, methods for producing electronic components, and methods for producing mount structures according to preferred embodiments of the present invention are not limited to the above-described features. For example, the configurations and production conditions of the electronic components and the mount structures can be changed or modified in various ways within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a body;
   an inner electrode within the body; and
   an outer electrode outside of the body; wherein
   the outer electrode includes an outermost layer that includes metal particles and is not electrically connected to the inner electrode;
   the outermost layer is configured to be electrically connected to the inner electrode after the metal particles are sintered; and
   the outermost layer of the outer electrode further includes a thermally decomposable resin.

2. The electronic component according to claim 1, wherein the thermally decomposable resin has a thermal decomposition temperature of about 100° C. or more and about 350° C. or less.

3. The electronic component according to claim 1, wherein the thermally decomposable resin is an acrylic resin, a butyral resin, or a cellulosic resin.

4. The electronic component according to claim 1, wherein the metal particles have an average particle size of about 10 nm or more and about 1000 nm or less.

5. The electronic component according to claim 1, wherein the outermost layer of the outer electrode further includes glass or a thermosetting resin.

6. The electronic component according to claim 1, wherein the outermost layer of the outer electrode has a thickness of about 1 µm or more.

7. The electronic component according to claim 1, wherein
   the outer electrode further includes an underlying layer disposed on a surface of the body; and
   the outermost layer is disposed on a surface of the underlying layer.

8. The electronic component according to claim 1, wherein the body is a ceramic body.

9. A method for producing a mount structure, the method comprising:
   providing an electronic component including:
      a body;
      an inner electrode within the body; and
      an outer electrode outside of the body; wherein
      the outer electrode includes an outermost layer that includes metal particles and is not electrically connected to the inner electrode; and
      the outermost layer is configured to be electrically connected to the inner electrode after the metal particles are sintered;
   mounting the electronic component on a land of a circuit board; and
   firing the electronic component on the land; wherein
   the firing the electronic component is performed to sinter the metal particles included in the outermost layer of the outer electrode.

10. The method for producing a mount structure according to claim 9, wherein
   the outermost layer of the outer electrode further includes a thermally decomposable resin; and
   the firing the electronic component is performed to decompose the thermally decomposable resin included in the outermost layer of the outer electrode.

11. The method for producing a mount structure according to claim 10, wherein the thermally decomposable resin has a thermal decomposition temperature of about 100° C. or more and about 350° C. or less.

* * * * *